(12) United States Patent
Gruner et al.

(10) Patent No.: US 7,551,263 B2
(45) Date of Patent: Jun. 23, 2009

(54) DEVICE FOR ADJUSTING THE ILLUMINATION DOSE ON A PHOTOSENSITIVE LAYER

(75) Inventors: Toralf Gruner, Aalen (DE); Markus Deguenther, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 306 days.

(21) Appl. No.: 11/409,387

(22) Filed: Apr. 13, 2006

(65) Prior Publication Data

US 2006/0244941 A1  Nov. 2, 2006

Related U.S. Application Data

(63) Continuation-in-part of application No. PCT/EP2004/010554, filed on Sep. 21, 2004.

(30) Foreign Application Priority Data

Oct. 18, 2003  (DE) ................ 103 48 513

(51) Int. Cl.
*G03B 27/72* (2006.01)
(52) U.S. Cl. .......................... 355/71; 355/67
(58) Field of Classification Search ............ 355/53, 355/67, 69
See application file for complete search history.

(56) References Cited

U.S. PATENT DOCUMENTS

| 5,473,410 | A | 12/1995 | Nishi |
| 5,895,737 | A | 4/1999 | McCullough et al. |
| 5,966,202 | A | 10/1999 | McCullough |
| 5,982,558 | A | 11/1999 | Fürter et al. |
| 6,013,401 | A | 1/2000 | McCullough et al. |
| 6,081,319 | A | 6/2000 | Ozawa et al. |
| 6,097,474 | A | 8/2000 | McCullough et al. |
| 6,285,443 | B1 | 9/2001 | Wangler et al. |
| 6,366,341 | B1 | 4/2002 | Shirato et al. |
| 6,404,499 | B1 | 6/2002 | Stoeldraijer et al. |
| 6,424,405 | B2* | 7/2002 | Kurosawa et al. ............ 355/53 |
| 2003/0002021 | A1* | 1/2003 | Sato ............................ 355/67 |
| 2003/0063266 | A1 | 4/2003 | Leenders et al. |
| 2003/0227603 | A1 | 12/2003 | Dierichs |
| 2004/0179178 | A1* | 9/2004 | Emoto ........................ 355/53 |

FOREIGN PATENT DOCUMENTS

| DE | 19548805 | 12/1995 |
| EP | 0720056 | 7/1996 |
| EP | 0952491 | 10/1999 |
| EP | 1020769 | 7/2000 |
| EP | 1291721 | 3/2003 |
| EP | 1349009 | 10/2003 |

\* cited by examiner

*Primary Examiner*—Diane I Lee
*Assistant Examiner*—Steven H Whitesell-Gordon
(74) *Attorney, Agent, or Firm*—Fish & Richardson P.C.

(57) ABSTRACT

A device for adjusting the illumination dose on a photosensitive layer in a microlithographic projection exposure apparatus has a plurality of stop elements which are, in a direction perpendicularly to a scanning direction of the apparatus, arranged next to one another. Each stop element has an outer surface that absorbs substantially all projection light impinging thereon, and a substantially rectangular circumference. Each stop element furthermore has at least one recess in its circumference or at least one opening through which projection light is allowed to pass. A drive unit individually displaces the stop elements along the scanning direction into a light field.

3 Claims, 8 Drawing Sheets

DEVICE FOR ADJUSTING THE ILLUMINATION DOSE ON A PHOTOSENSITIVE LAYER

CROSS-REFERENCE TO RELATED APPLICATIONS

This application is a continuation-in-part of and claims priority under 35 U.S.C. §120 to, international application PCT/EP2004/010554, filed Sep. 21, 2004, which claims priority of German patent application DE 103 48 513.9, filed Oct. 18, 2003. The full disclosure of these earlier applications is incorporated herein by reference.

BACKGROUND OF THE INVENTION

1. Field of the Invention

The invention relates to a device for adjusting the illumination dose on a photosensitive layer, which is applied to a support that can be displaced in a microlithographic projection exposure apparatus in a scanning direction relative to a projection lens of the projection exposure apparatus. The invention further relates to a method for the microlithographic production of microstructured components.

2. Description of Related Art

Microlithographic projection exposure apparatus, such as those which are used for the production of large-scale integrated electrical circuits, comprise an illumination system for the generation of a projection light beam, a projection lens, a reticle stage for displacing a reticle and a wafer stage for displacing a substrate. The substrate supports a photosensitive layer that is to be chemically modified under the effect of projection light. The reticle and the wafer stage are arranged with respect to the projection lens so that the reticle lies in an object plane and the substrate lies in an image plane of the projection lens. During the projection operation, the projection light passes through the reticle. The projection light then enters the projection lens that images the reticle onto the photosensitive layer.

In such projection exposure apparatus, the projection is often carried out in a scanning operation. This means that the reticle is moved progressively below a narrow slit-shaped light field with the aid of the reticle stage, while the substrate is displaced with the aid of the wafer stage relative to the projection lens. The ratio of the rates of displacement corresponds to the magnification of the projection lens which is usually<1.

In order to establish the slit-shaped light field, use is generally made of stops having a plurality of blades, which are arranged in or close to a field plane of the illumination system and are also referred to as REMA masks (REMA="REticle MAsking"). A lens in the illumination system comprising several lens elements projects the field plane onto the object plane of the projection lens, where the reticle is to be displaced.

Since exposure of the photosensitive material does not occur until a predetermined illumination dose is exceeded, it is necessary to ensure that all exposed regions on the substrate receive the same illumination dose. Inhomogeneities of the illumination dose can lead to variations in the structure width, since the position of the edges of the structures being produced by the projection exposure apparatus depends on whether or not the necessary illumination dose for exposing the photosensitive layer has been reached.

U.S. Pat. No. 6,404,499 A discloses a corrective device which can improve the homogeneity of the illumination dose. This known device has two mutually opposing arrangements of opaque finger-like stop elements, which are adjacent one another and aligned parallel with the scanning direction. Each pair of mutually opposing stop elements can be displaced in the scanning direction, so that the distance between the mutually opposing ends of the stop elements is variable. In this way, it is possible to establish a slit-shaped light field whose width along the scan direction varies along the longitudinal direction of the slit. Since integration of the light intensity occurs along the scanning direction because of the scanning movement, but not perpendicularly to it, the illumination dose can be defined, by moving the stop elements, for each longitudinal position of the slit-shaped light field.

U.S. Pat. No. 6,081,319 A discloses an illumination system having a gradation filter for obtaining inclined slopes in the irradiance distribution along the scan direction.

SUMMARY OF THE INVENTION

It is an object of the present invention to improve a device for adjusting the illumination dose on a photosensitive layer, and also to improve a method for the microlithographic production of microstructured components, such that the illumination dose on the photosensitive layer can be adjusted very accurately.

This object is achieved by a device for adjusting the illumination dose on a photosensitive layer, which is applied to a support that can be displaced in a microlithographic projection exposure apparatus in a scanning direction relative to a projection lens of the projection exposure apparatus. The device comprises a plurality of stop elements which are arranged next to one another perpendicularly to the scanning direction and can respectively be displaced individually in the scanning direction into a light field produced by the projection exposure apparatus. At least one stop element is, at least inside a subregion, partially transparent for the projection light being used in the projection exposure apparatus.

A method that achieves the above stated object comprises the following steps:
a) providing a support to which a layer of a photosensitive material is at least partially applied;
b) providing a reticle which contains structures to be projected;
c) projecting at least a part of the reticle onto a region on the layer by using a projection light beam, wherein the projection light beam passes through an arrangement of a plurality of stop elements which are arranged next to one another perpendicularly to a scanning direction and can respectively be displaced in the scanning direction into a light field;
d) having the projection light beam pass through at least one stop element with partial absorption, at least inside a subregion.

The invention is based on the discovery that it is more difficult to set up a predetermined illumination dose because the lasers conventionally used as a light source in projection exposure apparatus do not generate the projection light continuously, but in a pulsed form. Especially when the scanning velocities are high, this may mean that the number of light pulses striking a predetermined point on the photosensitive layer during the scanning process is not reliably defined, but varies statistically owing to the timing relation between the sequence of light pulses generated by the laser and the time window during which the relevant point moves through the light field. The effect of this, for example, is that n light pulses may strike the point in question whereas only n−1 light pulses strike an immediately adjacent point in the scanning direction, which is also intended to be exposed.

For this reason, especially if the number n of light pulses is relatively small because the scanning rates are high, the number of impinging light pulses and therefore the total illumination dose may fluctuate significantly.

With the inventive partial transparency of the stop elements, also light pulses with a fairly low intensity, for example only 50%, are now capable of reaching a point on the photosensitive layer. With an appropriate design of the transmission factor of the stop elements, the illumination dose fluctuations due to the pulsed light sources can thus be limited to a fraction of the illumination dose that is generated by a single light pulse.

In particular, the term partial transparency is intended here to mean that the stop element has a transmission factor of between approximately 1% and approximately 99%, in particular between approximately 5% and 95%, within the subregion. However, locally the transmission factor of the stop element may even reach 100%.

It is particularly straightforward, in terms of production technology, for the transmission factor to be constant inside the subregion.

Even more controlled adjustment of the illumination dose is moreover possible if the transmission factor is varied locally inside the subregion. Inside the subregion, for instance, the stop element may in particular have a grey-value profile which varies continuously in the scanning direction and, optionally, is designed so that the transmission factor of the stop element is greatest in the vicinity of the light field. Particularly continuous attenuation of the light pulses can in this way be achieved at the edges of the light field. Attenuation entirely without discontinuities is achieved when the grey value varies between approximately 100% and approximately 0% inside the subregion.

The stop elements may, for example, be designed as rods arranged parallel next to one another, as described in the aforementioned U.S. Pat. No. 6,404,499 A whose full disclosure is incorporated herein by reference. As an alternative to this, however, it is also possible to design the stop elements as short blades articulated to one another, as is known from U.S. Pat. No. 6,097,474, whose full disclosure is also incorporated herein by reference.

According to another aspect of the invention, a method for adjusting the illumination dose on a photosensitive layer, which is applied to a support that can be displaced in a microlithographic projection exposure apparatus in a scanning direction relative to a projection lens of the projection exposure apparatus, is provided. The projection exposure apparatus comprises a plurality of stop elements which are arranged next to one another perpendicularly to the scanning direction and can respectively be displaced individually in the scanning direction into a light field produced by the projection exposure apparatus, wherein at least one stop element is partially transparent for the projection light being used in the projection exposure apparatus (10), at least inside a subregion. The method comprises the following steps:

a) measuring the illumination dose at a plurality of points in an image plane of the projection lens;
b) comparing the measured values with corresponding setpoint values;
c) calculating rules for displacement movements of the stop elements in order to correct the illumination dose;
d) displacing the stop elements according to the rules found in step c).

According to a further aspect of the invention, a device is provided for adjusting the illumination dose on a photosensitive layer that is displaced in a microlithographic projection exposure apparatus along a scanning direction relative to a projection lens of the projection exposure apparatus. The device comprises a plurality of stop elements which are, in a direction perpendicularly to the scanning direction, arranged next to one another. Each stop element has an outer surface that absorbs substantially all projection light impinging thereon. Furthermore, each stop element has a substantially rectangular circumference and at least one recess in its circumference and/or at least one opening through which projection light is allowed to pass. A drive unit is provided for displacing the stop elements individually along the scanning direction into a light field.

According to this further aspect of the invention, a sharp increase of the irradiance distribution in the reticle plane along the scanning direction is avoided due to the recesses or openings in the stop elements. As a result of the completely absorbing surface of the stop elements, no refracted or reflected light portions, as they may occur when using semitransparent stop elements, may adversely affect the angular and dose distribution in the reticle plane.

According to still another aspect of the invention, an illumination system of a microlithographic projection exposure apparatus is provided that comprises an optical axis and illumination setting means that determine the angular distribution of projection light in a reticle plane. An illumination dose adjustment device is provided for adjusting the illumination dose on a photosensitive layer to be exposed. The illumination dose adjustment device comprises a plurality of stop elements which are, in a direction perpendicularly to a scanning direction of the microlithographic exposure apparatus, arranged next to one another. A drive unit makes it possible to displace the stop elements individually along the scanning direction into the light field. A manipulator is provided that is capable of displacing the illumination dose adjustment device along the optical axis.

According to this aspect of the invention, it is possible to obtain an at least substantially identical irradiance distribution in a reticle plane irrespective of the selected illumination setting.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
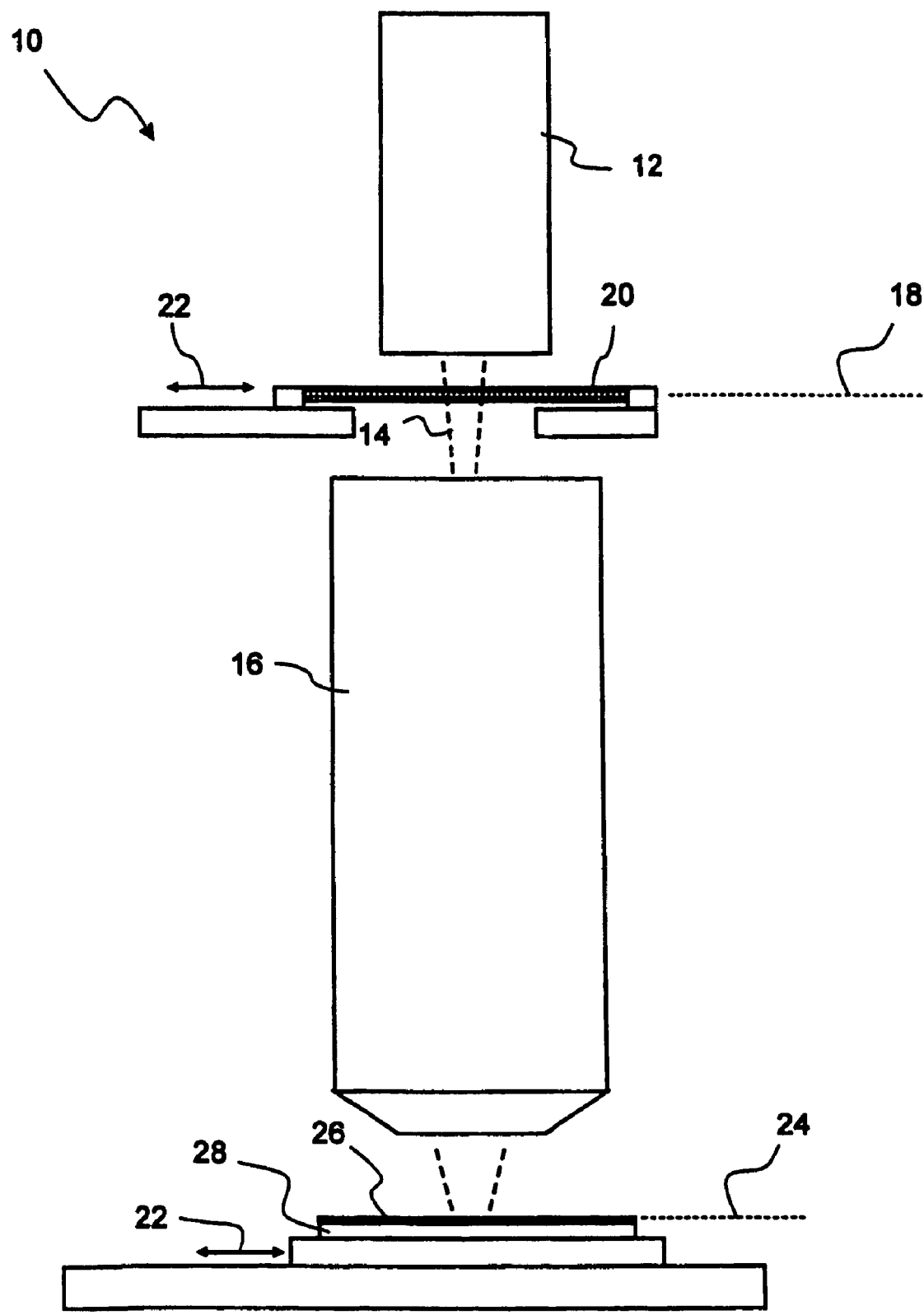
FIG. 1 shows a projection exposure apparatus in a schematized side view, which is not true to scale.

FIG. 1 shows a simplified side view, not true to scale, of a projection exposure apparatus that is denoted in its entirety by 10. The projection exposure apparatus 10 comprises an illumination system 12 that produces a projection light beam 14. The projection exposure apparatus 10 furthermore comprises a projection lens 16 having an object plane 18 in which a reticle 20 is arranged such that it can be displaced in a scanning direction 22. In an image plane 24 of the projection lens 16, there is a photosensitive layer 26 applied to a substrate 28 which, for example, may be a silicon wafer. The substrate 28 with the photosensitive layer 26 applied to it can also be displaced in the scanning direction 22. The ratio between the rate of displacement of the substrate 28 and the rate of displacement of the reticle 20 corresponds to the magnification of the projection lens 16, which may for example be 1:4.

Figure 2:
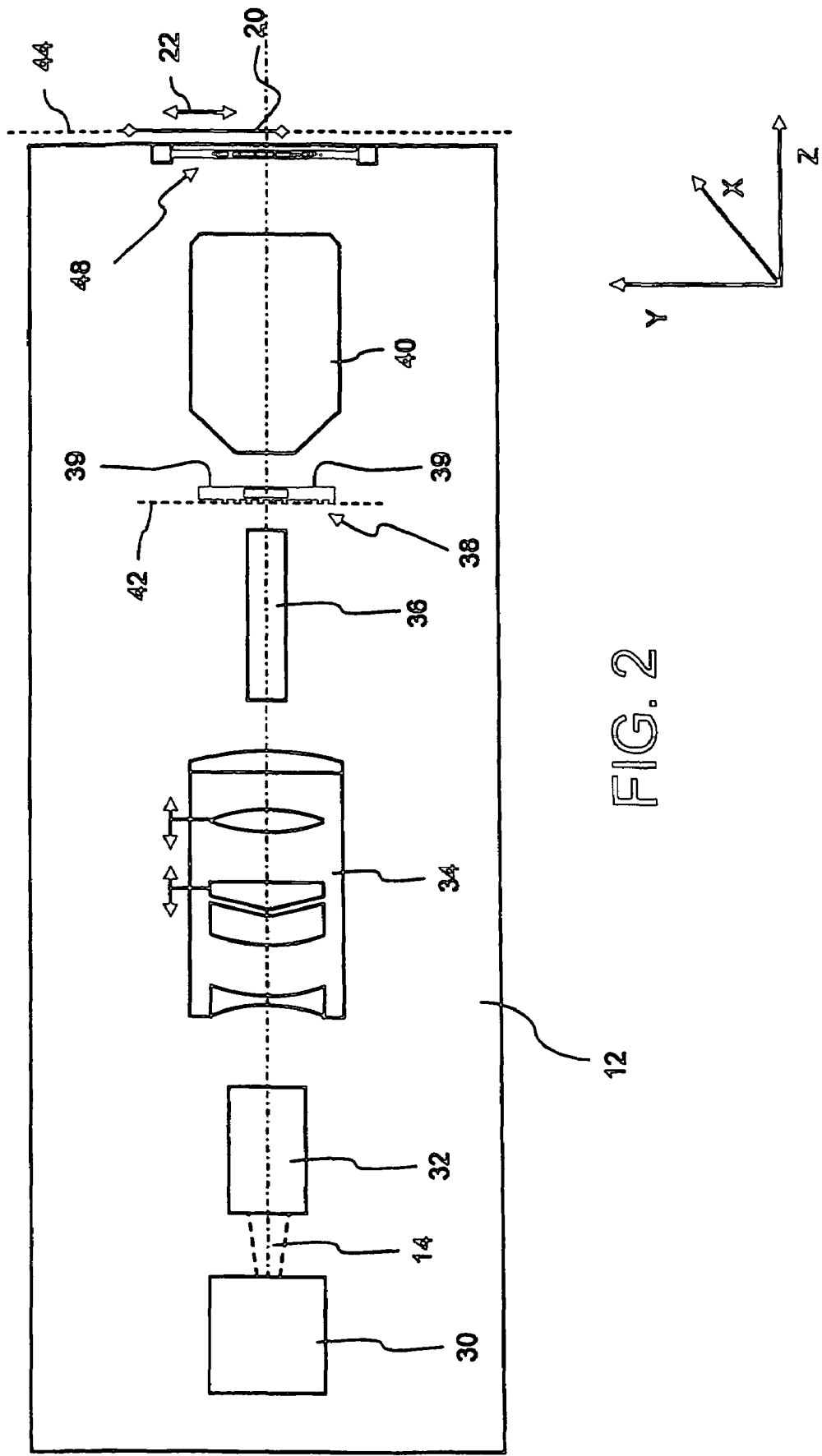
FIG. 2 shows a simplified meridional section of essential components of an illumination system of the projection exposure apparatus as shown in FIG. 1.

FIG. 2 shows, in a simplified meridional section, details of the illumination system 12. The illumination system 12 contains a light source 30, which produces a regular high frequency sequence of short light pulses forming the projection light beam 14. The light source 30 may, for example, be an excimer laser which generates projection light having a wavelength λ of 193 nm.

The projection light beam 14 generated by the light source 30 first passes through a beam reshaping unit 32, a zoom-axicon objective 34 for setting different types of illumination, and optionally a rod homogenizer 36 which is used to mix and homogenize the projection light beam generated by the light source 30. An adjustable masking unit 38, which can be used to set up a slit-shaped geometry of the light field passing through the reticle 20, is arranged behind the rod homogenizer 36 in the light propagation direction. To that end, the masking unit 38 comprises two pairs of mutually opposing blades arranged perpendicularly to one another. Only the blades lying in the scanning direction 22 (Y direction) can be seen in FIG. 2 and are denoted by 39.

The illumination system 12 furthermore comprises a masking objective 40 having an object plane 42 in which the masking unit 38 is arranged. In an image plane 44 of the masking objective 40, which coincides with the object plane 18 of the projection lens 16, the reticle 20 to be projected can be displaced in the scanning direction 22.

In this way, the masking unit 38 is projected onto the reticle 20 by the masking objective 40 so that the light field is sharply delimited along the X direction. Since the illumination system 12 is to this extent known, reference may be made to U.S. Pat. No. 6,285,443 for further details. The full disclosure of this patent is incorporated herein by reference.

The illumination system 12 furthermore contains a dose adjusting device 48, which is arranged as close as possible to a field plane, for example directly in front of the image plane 44 of the masking objective 40. The purpose of the dose adjusting device 48 is to adjust and, in particular, to homogenize the illumination dose on the photosensitive layer 26.

Figure 3:
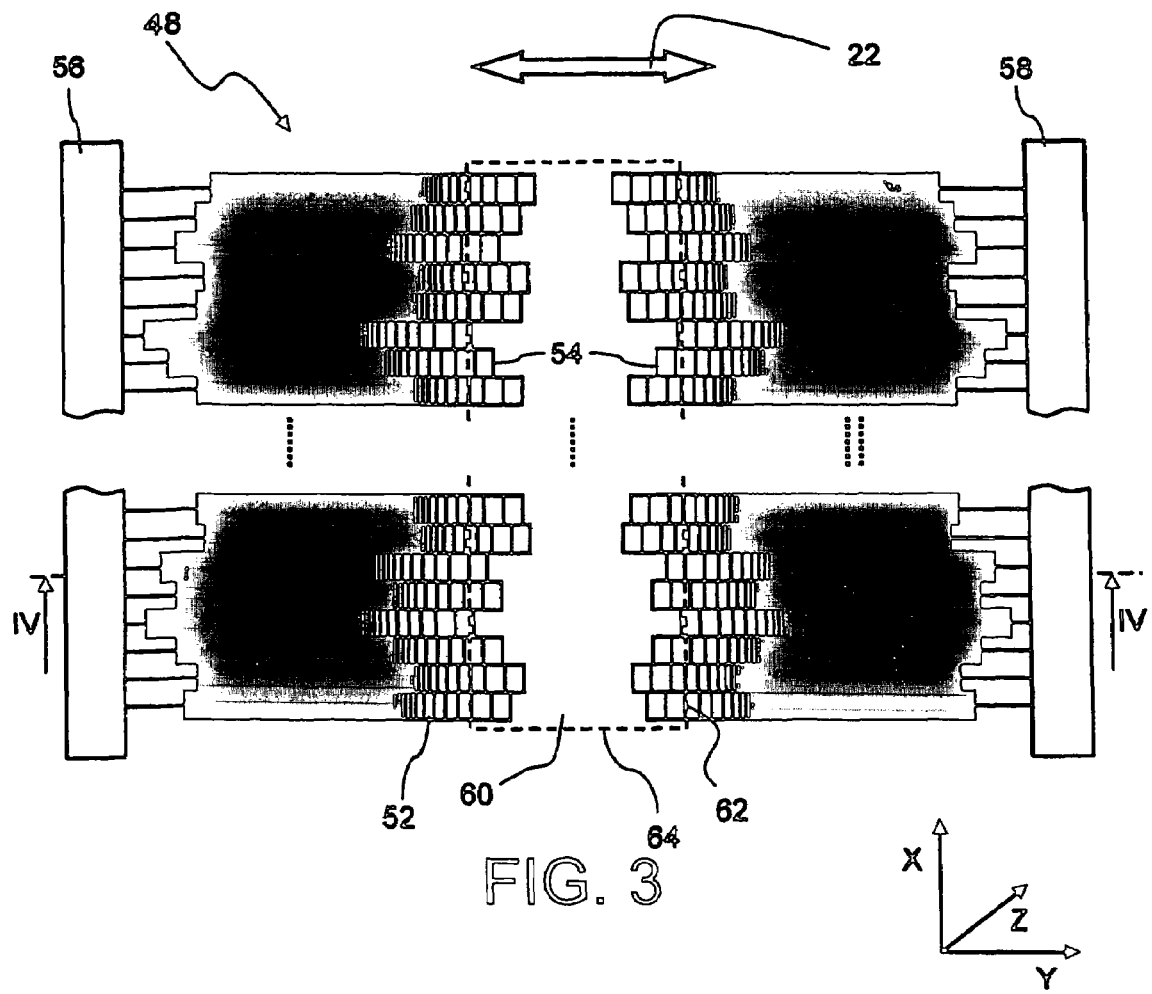
FIG. 3 shows a plan view of a device according to the invention for adjusting the illumination dose, which is part of the illumination system as shown in FIG. 2.
Figure 4:
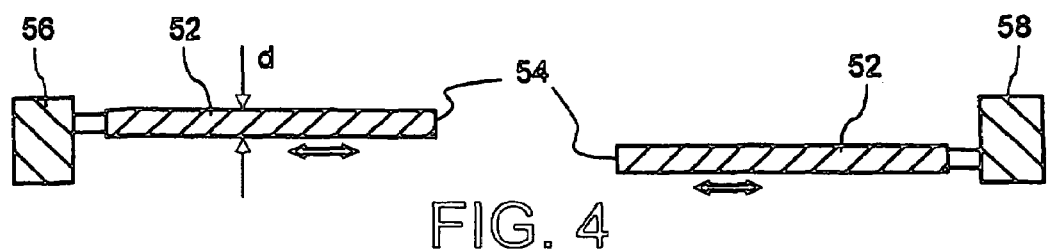
FIG. 4 shows a section along the line IV-IV through the device as shown in FIG. 3.

To that end, the dose adjusting device 48, which is illustrated on an enlarged scale in FIGS. 3 and 4 in a plan view and in a lateral section along the line IV-IV, respectively, comprises a plurality of movably arranged stop elements 52. These are designed as finger-like rods which, in the exemplary embodiment represented in FIGS. 3 and 4, face one another in a cantilevered fashion in different planes. The stop elements 52 are divided into two mutually opposing groups, within which they respectively adjoin one another along their longitudinal sides and can be displaced individually in the scanning direction 22 (Y direction). Drive units 56, 58 (not represented in detail) as are described in the aforementioned U.S. Pat. No. 6,097,474, for example, are used for this purpose.

The drive units 56, 58 are in this case controlled in such a way that two stop elements 52 facing one another can be displaced synchronously in opposite directions. In this way, it is possible for free ends 54 of the stop elements 52 to be displaced into the projection light beam 14 so as to modify the shape of the slit-shaped light field already defined by the masking unit 38, which is indicated by dashes in FIG. 3 and is denoted by 60. Here, the modifications just affect the longitudinal sides 62 of the slit-shaped light field 60, whereas the transverse sides 64 are not changed by the dose adjusting device 48 and are therefore defined only by the masking unit 38.

Figure 5:
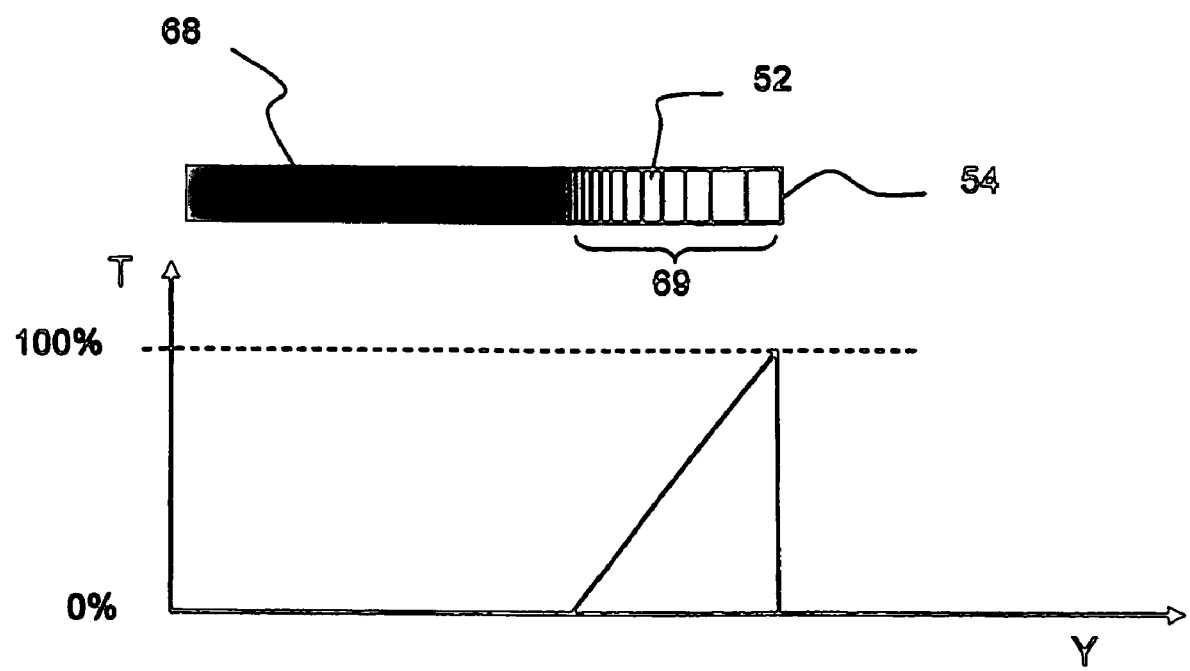
FIG. 5 shows a graph which illustrates the transmission profile for a stop element of the device as shown in FIGS. 3 and 4.

The rod-shaped stop elements 52 each have a continuous grey-value profile, as represented on the graph shown in FIG. 5. The transmission factor T is plotted there against the Y direction, i.e. the scanning direction 22, for a stop element 52 in the group represented on the left in FIG. 3. The grey-value profile for the stop elements 52 of the other group is the mirror image.

FIG. 5 shows that the stop elements 52 each have a region 68 which is opaque for the projection light and a region 69 which is at least partially transparent for the projection light. In the partially transparent region 69, the transmission factor T decreases from 100% at the free end 54 of the stop element 52 to 0% at the junction with the opaque region 68. This reduction of the transmission factor is indicated by vertical hatching in FIGS. 3 and 5, the density of which respectively increases towards the opaque region 68.

In order for the dose adjusting device 48 to affect the phase of the transmitted projection light beam 14 as homogeneously as possible over the light field 60, the thickness (indicated by d in FIG. 4) of the stop element 52 should be selected to be as thin as possible so as to minimize the phase change in the vicinity of the free ends 54.

Figure 6:
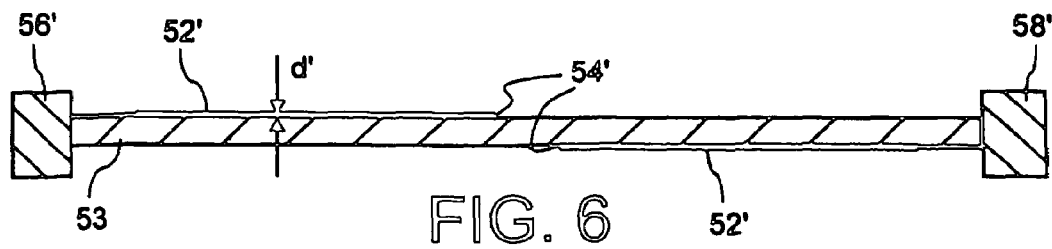
FIG. 6 shows a representation corresponding to FIG. 4 for another exemplary embodiment of the invention.

FIG. 6 shows a representation, analogous to FIG. 4, of a variant of a dose adjusting device with particularly thin stop elements. The stop elements 52' are in this case designed as thin finger-like strips, which rest on a transparent plane-parallel plate 53 and are held by it using adhesion forces. The thickness of these stop elements 52' is denoted by d' in FIG. 6.

The effect of the dose adjusting device 48 will now be explained in more detail below with reference to FIGS. 7 to 9. These respectively show graphs in which the intensity I is plotted as a function of time t for a particular point on the reticle 20. It is assumed here that this point is being moved in the scanning direction 22 through the light field 60 whose shape is modified by the dose adjusting device 48.

Figure 7:
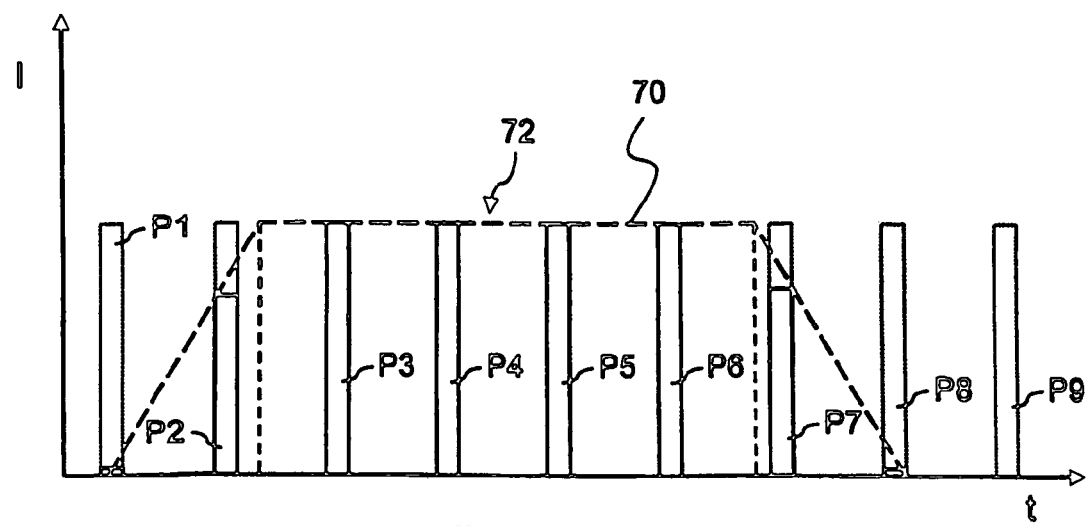
FIG. 7 shows the intensity encountered during a scanning process at a point on the reticle as a function of time when using the device according to the invention.

The transmission profile 70 generated by the dose adjusting device 48 is depicted by a dashed line in FIG. 7. The transmission profile 70 has a plateau-shaped section 72, which corresponds to the free region between two free ends 54 of mutually opposing stop elements 52. On either side of the plateau-shaped element section 72, the transmission factor approximately decreases linearly towards zero owing to the grey-value profile of the stop elements 52 as shown in FIG. 5.

The light pulses generated by the light source 30 are indicated by narrow rectangles P1 to P9, which are represented using dotted lines outside the transmission profile 70. When the relevant point on the reticle 20 enters the light field 60, the first two light pulses P1 and P2 will only be partially transmitted by the dose adjusting device 48 since the light pulses P1 and P2 cannot reach the point in question unless they have passed through the partially transparent section 69 of a stop element 52. The same applies to the later light pulses P7 and P8, when the point in question is moving out of the light field 60. Only the intermediate light pulses P3 to P6 can reach the relevant point without being attenuated by the dose adjusting device 48. The total illumination dose, which has the unit Ws/m$^2$ in photometry, is obtained in geometrical terms by adding up the areas of the light pulses P1 to P8 lying below the transmission profile 70.

As can be seen in FIG. 7, however, this total area does not change substantially when the timing relation between the light pulses P1 to P9, on the one hand, and the transmission profile 70 given by the scanning movement is changed. If the light pulses P1 to P9 are shifted by a half period to the right in FIG. 7, for example, the increase of the illumination dose due to the light pulses P1 and P2 is substantially compensated for by a corresponding decrease of the illumination dose resulting from the fact that the light pulses P7 and P8 move out of the transmission profile 70.

Figure 8:
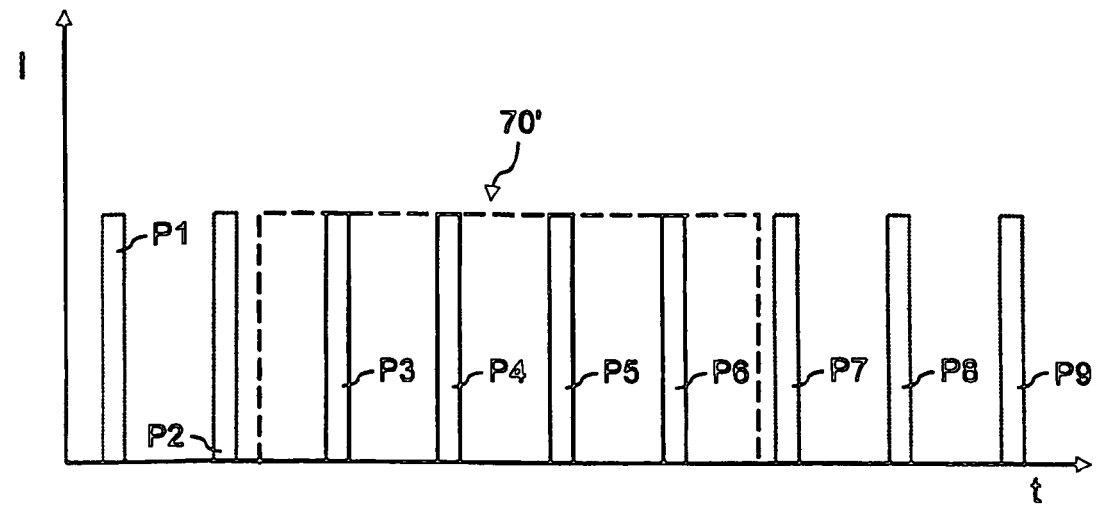
FIG. 8 shows a graph corresponding to FIG. 7, the scanning process being carried out without using the device according to the invention.
Figure 9:
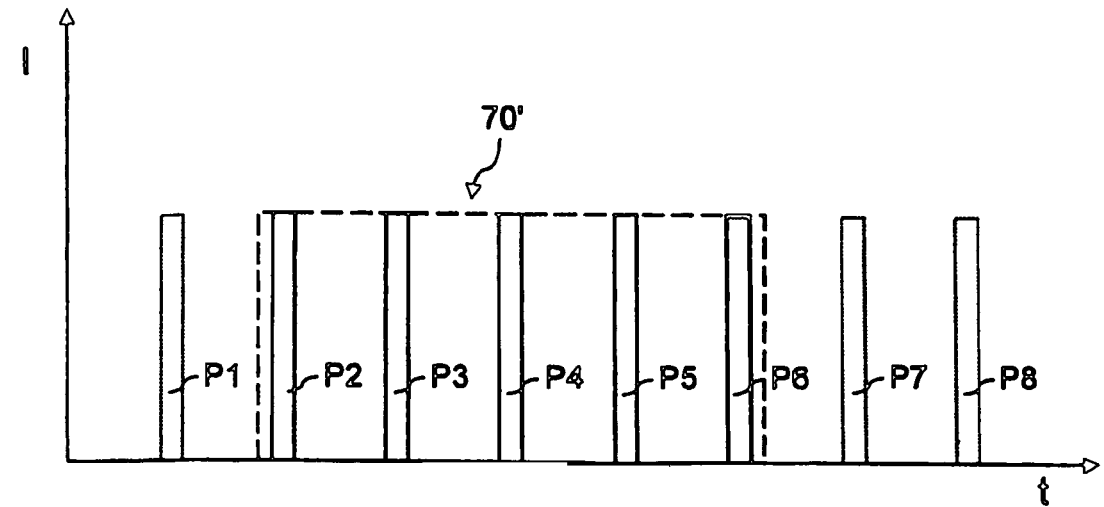
FIG. 9 shows a representation corresponding to FIG. 8, but with another timing relation between the light pulses and the movement of the reticle.

FIGS. 8 and 9 show analogous graphs to FIG. 7, in which it is assumed for comparison that the stop elements 52 are entirely opaque. In this case, the transmission profile 70' does not have a ramp-like profile at its ends in the scanning direction 22, but is rectangular. The effect of this is that the number of light pulses lying inside the transmission profile 70' varies significantly depending on the timing relation between the scanning movement and the light pulses.

This can be seen from a comparison of FIGS. 8 and 9. Between FIGS. 8 and 9, the sequence of the light pulses P1 to P9 has been offset by a half period in time. As can be found by comparing the number of light pulses lying inside the transmission profile 70', the relevant point on the reticle 20 is exposed to a total of four light pulses P3 to P6 in the case shown in FIG. 8, whereas it is exposed to a total of five light pulses P2 to P6 in the case shown in FIG. 9. With the timing relation between the scanning movement and the light pulses P1 to P9 as shown in FIG. 9, the illumination dose at this point is therefore 25% more than with the timing relation shown in FIG. 8.

As is the case in the exemplary embodiment described above, the dose adjusting device 48 may be provided in addition to the masking unit 38. The purpose of the masking unit 38 is merely then to sharply delimit the short transverse sides 64 of the light field 60. The masking unit 38 is also used to prevent any unstructured regions of the reticle 20 from being exposed to projection light 14 when the reticle 20 is entering and leaving the light field. To that end, the masking unit 38 may have blades which can be displaced in the Y direction. The movement of the blades is matched to the scanning movement when the reticle 20 enters and leaves the light field. Such masking units are known from U.S. Pat. No. 5,473,410 A, so that further details need not be explained. To obtain an approximately trapezoidal transmission profile even without stop elements 52 inserted into the light field 60, the blades 39 for the masking unit 38 which delimit the light field 60 in the scanning direction 22 may be arranged not exactly in the object plane of the masking objective 40, but slightly defocused. These blades are not therefore projected sharply onto the reticle 20, and this leads to an approximately trapezoidal transmission profile.

In principle, however, the masking unit 38 may also be entirely replaced by the dose adjusting device 48, which should then be arranged in the object plane 42 of the masking objective 40. In this case, the dose adjusting device 48 merely needs to be supplemented by additional stop elements which sharply delimit the transverse sides 64 of the light field 60 in the X direction. Since the stop elements 52 can also be displaced in the Y direction and furthermore include the completely opaque regions 68, a suitable displacement movement of the stop elements 52 can be used to ensure that no unstructured regions of the reticle 20 are exposed to the projection light beam 14 when the reticle 20 enters and leaves the light field 60.

In another alternative embodiment, the at least partially transparent region 70 may have a homogeneous transmission factor, for example 50%. In this case, the transmission profile 70 is delimited by steps rather than by linear ramps in the scanning direction 22. Such a stepped delimitation of the transmission profile 70 also leads directly—albeit less so—to homogenization of the illumination dose which can be achieved on the photosensitive layer 26 with pulsed light sources 30.

The following procedure may be adopted so that the stop elements 52 can be displaced in such a way as to achieve a maximally homogeneous (or other desired) distribution of the illumination dose in the image plane 24 of the projection lens 16:

First, the illumination dose is measured at a plurality of points in the image plane 24 of the projection lens 16. The measuring points are in this case preferably distributed uniformly along the strip-shaped area onto which the projection lens 16 projects the light field 60 generated by the illumination system. An example of a suitable measuring instrument is a CCD sensor, which is arranged in place of the photosensitive layer 26 in the image plane of the projection lens 16 and integrates the light pulses generated by the light source 30.

In another step, the measured values are compared with corresponding setpoint values. If a homogeneous illumination dose is intended—as will usually be the case—then all the setpoint values will be the same.

Computational rules are then determined for the displacement movements of the stop elements 52, which are needed in order to correct any deviations of the illumination dose that may be measured. Lastly, the stop elements 52 are displaced according to these rules. Another measurement of the illumination dose may be carried out for verification.

According to a preferred embodiment, the stop elements 52 of the embodiments shown in FIGS. 3 to 5 comprise thin support plates that are transparent for the projection light 14. The support plates may be made, for example, of $SiO_2$ or $CaF_2$, depending on the wavelength of the projection light produced by the light source 30. On the support plates a light absorbing material, for example chromium, is applied. In order to obtain a varying transparency of the stop elements 52 in the region 69, the material may be applied as small dots whose density varies, preferably continuously towards the free end of each stop element 52.

As has been mentioned above, the phase of the transmitted projection light should be affected as little as possible, or at least as homogenously as possible, by the dose adjusting device. Having very thin support plates is one way to ensure that the phase of the transmitted projection light is not substantially affected. However, using very thin support plates has some drawbacks as far as the mechanical stability is concerned. Since the stop elements 52 are moved by the drive units 56, 58, there is a considerable risk that the thin and therefore brittle support plates may be damaged. This even holds true for the embodiment shown in FIG. 6 in which an additional plate 53 supports the stop elements 52'.

However, even if these mechanical problems are under control, there will nevertheless be an undesired phase modification caused by the dose adjusting device. Apart from that, projection light may be refracted and (totally) reflected at the surfaces of each stop element 52. This is of particular concern in the vicinity of the (small) gaps between adjacent stop elements 52. For example, some light rays may pass through the gaps without impinging on the lateral surfaces of the support plates, and thus without undergoing refraction or reflection. However, other light rays having larger angles of incidence may impinge on these surfaces so that they are refracted and partly or totally reflected. Other light rays that impinge on a semi-transparent portion of a stop element 52 under a large angle of incidence may pass through two adjacent stop elements 52, thereby traversing four refracting surfaces. The refracted and (totally) reflected light portions have a negative impact on the angular and irradiance distribution of the projection light obtained in the image plane 44 in which the reticle 20 is positioned.

Figure 10:
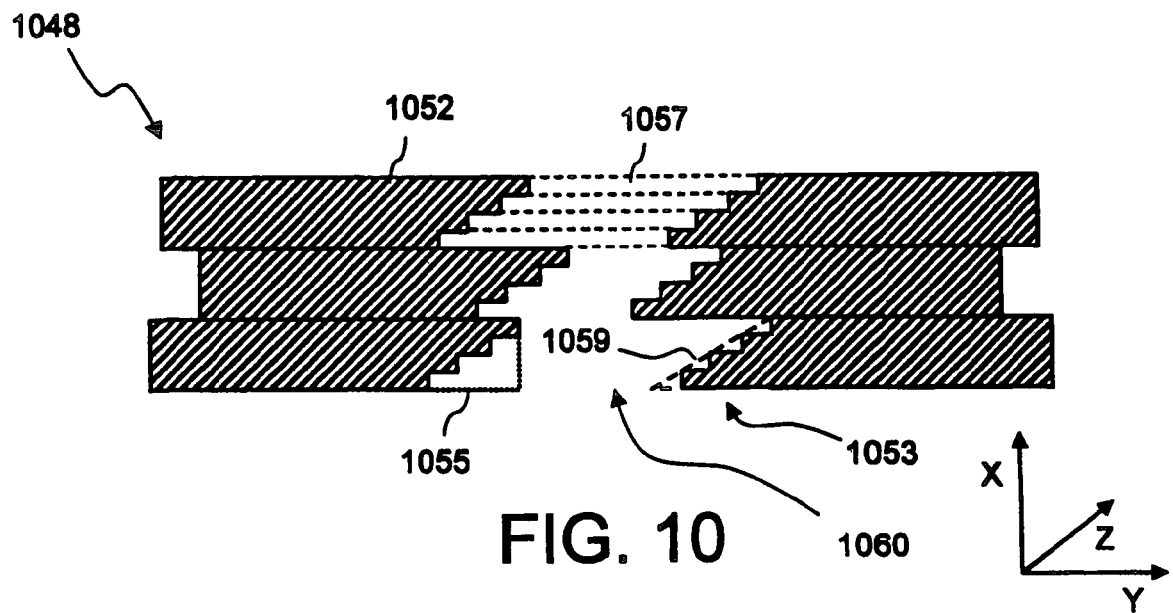
FIG. 10 shows a plan view of another embodiment of a dose adjusting device comprising stop elements with stepped end portions.
Figure 11:
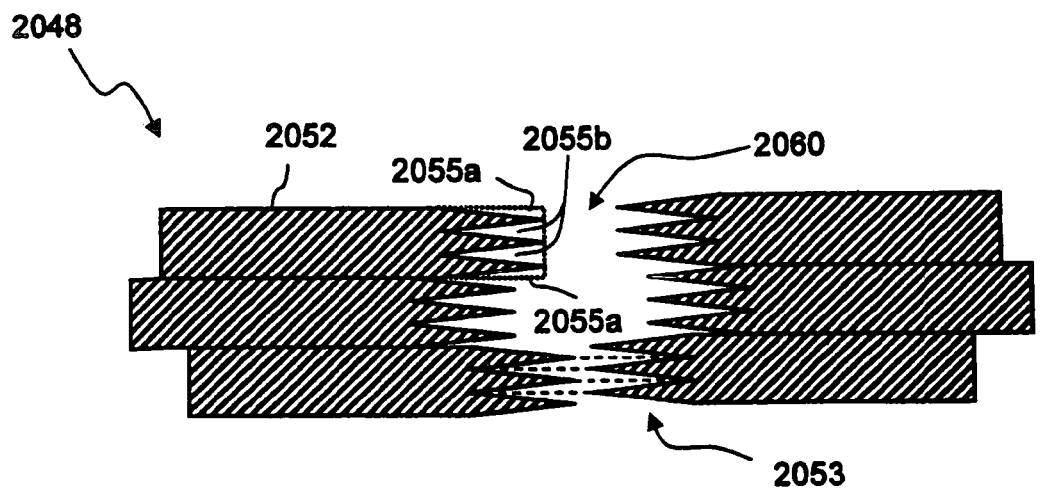
FIG. 11 shows a plan view of a further embodiment of a dose adjusting device comprising stop elements with frayed end portions.
Figure 12:
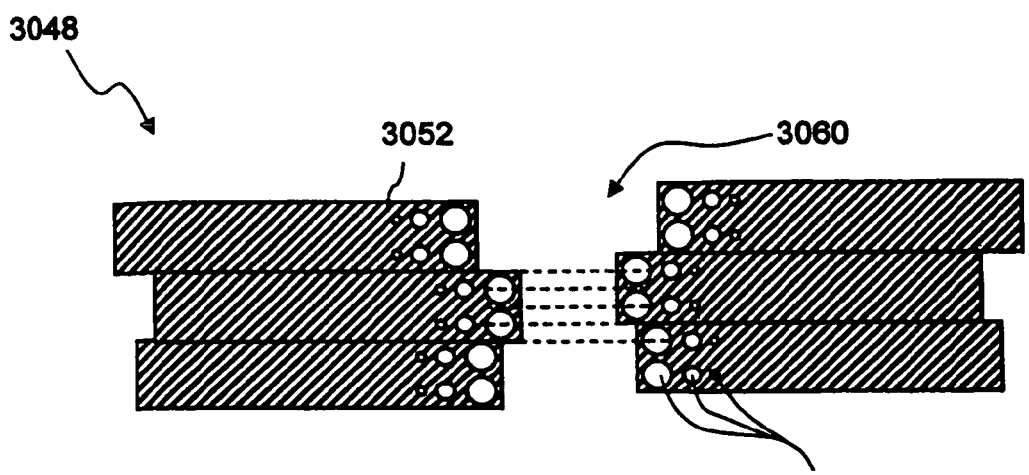
FIG. 12 shows a plan view of yet another embodiment of a dose adjusting device comprising stop elements having end portions with circular openings.

FIGS. 10 to 12 show plan views of stop elements according to preferred embodiments in which no refraction or reflection occurs in the dose adjusting device. The stop elements in these embodiments are arranged as two mutually opposing groups similar to FIG. 3. For the sake of simplicity, only three adjacent stop elements are shown on each side, and also drive units for displacing the stop elements along the scanning direction 22 are not illustrated. It is to be understood, however, that an adjustment device may comprise significantly more stop elements than are shown in FIGS. 10 to 12.

The dose adjusting device 1048 shown in FIG. 10 comprises stop elements 1052 that are made of a material that completely absorbs projection light. This means that light impinging on the outer surface of each stop element 1052 is absorbed by (almost) 100%. This also holds true for the lateral sides of the stop elements 1052, and preferably also for the underside of the stop elements 1052 which is not directly exposed to projection light. In a preferred embodiment, the stop elements 1052 are made of absorbing metal sheets, or of thin plastic plates that are completely covered by an absorbing metallic layer. Thus there is no light that passes through a stop element 1052, as is the case with the semi-transparent stop elements 52 shown in FIGS. 3 to 6.

In order to obtain a substantially trapezoidal transmission profile 70 as indicated in FIG. 7, end portions 1053 of the stop elements 1052 are provided with recesses 1055. Each recess 1055 has a stepped profile so that the remaining part of the end portion 1053 also has a stepped profile. As a result, more light passes at the tip of each end portion 1053 than one or two steps further away from the tip.

Since opposite stop elements 1052 have recesses in a point mirrored mutual relationship, the light field 1060 between the opposing groups of stop elements 1052 is subdivided into a plurality of narrow elongated stripes 1057. In the embodiment shown, the stripes 1057 between a pair of opposing stop elements 1052 all have the same length and width.

From FIG. 10 it also becomes clear that the shapes of the opposing stop elements 1052 are complementary to each other. As a result, the adjustment device 1048 completely blocks projection light if all stop elements 1052 are moved into the light field 1060 until the end portions 1053 of opposing stop elements 1052 abut.

Since the stop elements 1052 are completely absorbing, no refraction or reflection occurs at the top, front or lateral surfaces of each stop element 1052. This prevents any undesired deviations of light rays or phase shifts that may adversely affect the desired angular and irradiance distribution in the image plane 44 where the reticle 20 is positioned. Nevertheless a transmission profile 70 as shown in FIG. 7 is, at least approximately, obtained. The transmission profile obtained with the dose adjusting device 1048 will not have linear flanks at both sides of the plateau-shaped section 72, but stepped flanks. However, the steps are not sharp if the stop elements 1052 are not exactly positioned in a field plane which is conjugate to the image plane 44 in which the reticle 20 is positioned. Apart from that, the smoothness of the stepped flanks may be increased by increasing the number of steps of the recesses 1055.

If the number of steps is increased to infinity, each recess will have the shape of a rectangular triangle. Such a triangular recess is denoted in FIG. 10 by 1059 for one of the stop elements 1052 on the right side. The ratio between the opaque area and the recess area then decreases linearly towards the light field 1060, and consequently a trapezoidal transmission profile as shown in FIG. 7 is obtained.

FIG. 11 shows another dose adjusting device 2048 in which each stop element 2052 has four triangular recesses 2055a, 2055b formed at the tip of the end portions 2053. The recesses 2055a at the lateral sides are obtained by dividing in half the recesses 2055b in the center. The end portions 2053 thus have a toothed or frayed shape. Also in this embodiment, the ratio between the opaque area and the recess area decreases linearly towards the light field 2060, resulting in a trapezoidal transmission profile.

In order to ensure that the distance along the scan direction 22 (Y direction) is constant between each pair of opposing stop elements 2052, the groups of opposing stop elements 2052 are slightly laterally displaced by a distance d along the X direction, wherein d is equal to one half of the length of the base line of the center recesses 2055b. This also ensures that the two opposing groups of stop elements 2052 form a completely opaque surface if opposing stop elements 2052 abut.

Since also in this embodiment the stop elements 2052 are completely opaque for the projection light, no refraction or (total) reflection occurs that may disturb the desired angular and irradiance distribution obtained in the image plane 44 where the reticle 20 is positioned.

FIG. 12 shows another embodiment of a dose adjusting device which is denoted by 3048. In this embodiment the dose adjusting device 3048 comprises stop elements 3052 that have still a rectangular circumference as the stop elements 52 shown in FIGS. 3 to 6. Instead of having recesses that alter the circumference, the stop elements 3052 comprise a plurality of openings 3061. In the exemplary embodiment shown in FIG. 12, each stop element 3052 comprises three pairs of circular openings 3061, wherein the openings 3061 of each pair have equal areas. The closer the openings 3061 are located towards the light field 3060, the larger the areas of the openings become. If the areas increase linearly with decreasing distance from the light field 3060, the resulting intensity profile obtained with the stop elements 3052 is similar to the profile which is achieved with the stop elements 1052 having stepped end portions 1053, as shown in FIG. 10. Also in this embodiment the groups of opposing elements 3052 may be laterally displaced in a similar way as has been explained above with reference to the embodiment shown in FIG. 11. Again, no refraction or (total) reflection occurs, and thus adverse effects on the angular and irradiance distribution in the image plane 44 where the reticle 20 is positioned are avoided.

In the embodiments described above with reference to FIGS. 10 to 12 it has been assumed that a trapezoidal transmission profile is desired. However, for completely avoiding the pulse quantization effect it has been found that an irradiance distribution in the reticle plane having Gaussian flanks in the scanning direction is often even more preferable. For that reason the recesses 1055 and 2055a, 2055b and the openings 3061 may be designed such that the transmission profile has—at least substantially—Gaussian flanks.

Figure 13:
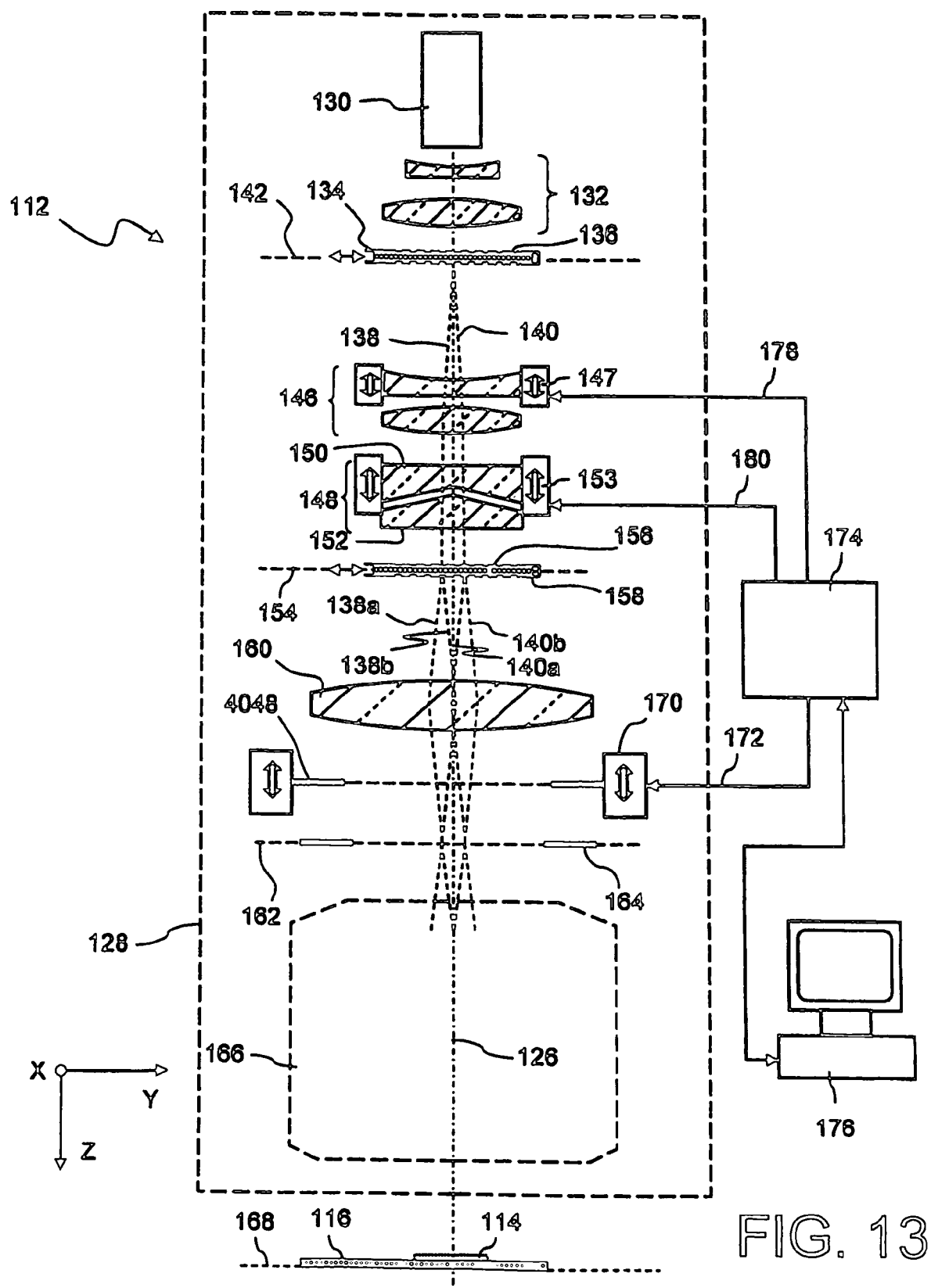
FIG. 13 shows a simplified meridional section of essential components of an illumination system according to another preferred embodiment.

FIG. 13 is a detailed meditational section through an illumination system 112 according to another preferred embodiment that does not comprise a rod homogenizer. For the sake of clarity, the illustration of FIG. 13 is also considerably simplified and not to scale. This particularly implies that different optical units are represented by very few optical elements only. In reality, these units may comprise significantly more lenses and other optical elements.

The illumination system 112 comprises a housing 128 and a light source that is, in the embodiment shown, realized as an excimer laser 130. The excimer laser 130 emits projection light that has a wavelength of about 193 nm. Other wavelengths, for example 248 nm or 157 nm, are also contemplated.

The projection light bundle emitted by the excimer laser 130 enters a beam expansion unit 132 in which the projection light bundle is expanded. After passing through the beam expansion unit 132, the projection light bundle impinges on a first optical raster element 134. The first optical raster element 34 is received in a first exchange holder 136 so that it can easily be replaced by other optical raster elements having different properties. The first optical raster element 134 comprises, in the embodiment shown, one or more diffraction gratings that deflect each incident ray such that a divergence is introduced. This means that, at each location on the optical raster element 134, light is diffracted within a certain range of angles. This range may extend, for example, from −3° to +3°. In FIG. 13 this is schematically represented for an axial ray that is split into two diverging rays 138, 140. The first optical raster element 134 thus modifies the angular distribution of the projection light and influences the local intensity distribution in a subsequent pupil plane. Other kinds of optical raster elements, for example micro-lens arrays, may be used instead or additionally.

The first optical raster element 134 is positioned in an object plane 142 of an objective 144 that comprises a zoom lens group 146 and a pair 148 of axicon elements 150, 152. The zoom lens group contains at least one lens that can be displaced along the optical axis 126 by means of a zoom manipulator that is schematically indicated by 147.

The axicon elements 150, 152 have opposing conical faces and a distance along the optical axis 126 that can be varied. To this end the axicon element 150 having a concave conical face can be displaced along the optical axis 126 by means of an axicon manipulator 153. If both axicon elements 150, 152 are in contact, the axicon pair 148 has the effect of a plate having parallel plane surfaces. If both elements 150, 152 are moved apart, the spacing between the axicon elements 150, 152 results in a shift of light energy radially outward.

By adjusting the zoom lens group 146 and the axicon pair 148 using the manipulators 147 and 153, respectively, it is possible to change the intensity distribution in a subsequent pupil plane, and thus the angular distribution of the projection light impinging on a reticle 116. This process of changing the angular distribution is usually referred to as a change of the illumination setting. Since devices and methods for changing the illumination setting are known such in the art as such, these will not be explained here in further detail.

Reference numeral 154 denotes an exit pupil plane of the objective 144. A second optical raster element 156 comprising micro-lens arrays is received in a second exchange holder 158 that is positioned in or in close proximity to the exit pupil plane 154 of the objective 144. The second optical raster element 156 introduces a divergence for each point and influences the geometry of the illuminated field 114 on the reticle 116. The divergence introduced by the second optical raster element 156 is schematically represented in FIG. 13 by divergent rays 138a, 138b and 140a, 140b for the impinging rays 138 and 140, respectively. If the illuminated field 114 has the shape of a curved slit, the exit side numerical aperture of the second optical raster element 156 may be in the range from 0.28 to 0.35 in the X direction and in the range from 0.07 to 0.09 in the Y direction.

The diverging rays 138a, 138b and 140b emerging from the second optical raster element 156 enter a condenser 160 that is represented in FIG. 13 by a single lens element for the sake of simplicity.

The entrance pupil plane of the condenser 160 coincides with the exit pupil plane 154 of the objective 144. An image plane 162 of the condenser 160 is a field plane, close to which a field stop 64 is positioned. The field stop 164 ensures sharp edges of the illuminated field 114 for the short lateral sides extending along the Y-direction. A field stop objective 166 images the field stop 164 onto a reticle plane 168 in which the reticle 116 is positioned.

In the vicinity of the field plane 162 a dose adjustment device 4048 is arranged. The dose adjustment device 4048 may be realized as one of the embodiments described above with reference to FIGS. 3 to 6 and 10 to 12. However, it is also possible to use a conventional dose adjustment device with rectangular opaque stop elements, as is disclosed in U.S. Pat. No. 6,404,499 A.

The dose adjustment device 4048 can be displaced in its entirety along the optical axis 126 using an adjustment manipulator 170. The adjustment manipulator 170 is connected via a control line 172 to a control unit 174. The control unit 174 is connected to an overall apparatus control terminal 176 including man machine interfaces such as keyboards and displays. The apparatus control terminal 176 is used to control the operation of the entire projection exposure apparatus, and in particular to select a desired illumination setting. To this end the control unit 174 is connected via control lines 178, 180 to the zoom manipulator 147 and the axicon manipulator 153, respectively. As a matter of course, the control unit 174 could also be formed as a part of the apparatus control terminal 176.

Figure 14:
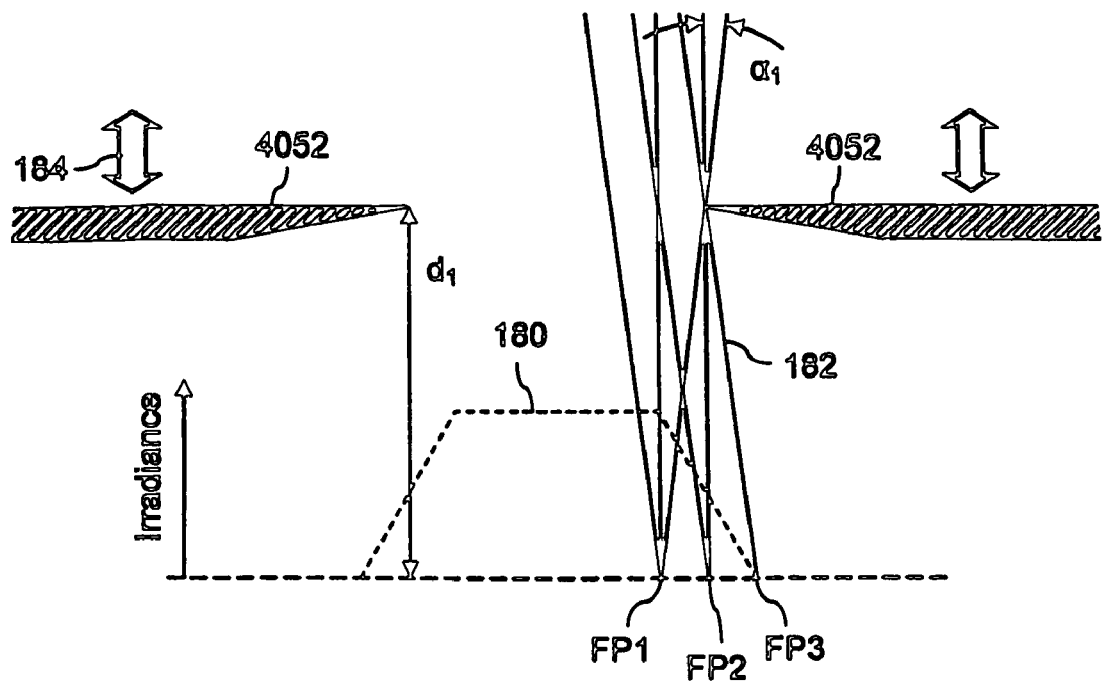
FIGS. 14 and 15 are enlarged cutouts of FIG. 13 for illustrating the effect of different illumination settings on the irradiance distribution obtained in a reticle plane.

FIG. 14 is an enlarged cutout of FIG. 13 in which two stop elements 4052 of the dose adjusting device 4048 and the field plane 162 are shown for a first illumination setting. Here it is assumed that a conventional illumination setting with a small coherence parameter σ has been selected at the apparatus control terminal 176. This means that the maximum angle $\alpha_1$ is relatively small. Since the stop elements 4052 are defocused, i.e. positioned at a distance $d_1$ away from the field plane 162, a substantially trapezoidal irradiance distribution is obtained in the field plane 162. This irradiance distribution is indicated in FIG. 14 by a dashed line 180. The nature of this trapezoidal irradiance distribution 180 may be explained as follows:

At all field points FP1 below the horizontal section of the irradiance distribution 180 the same (maximum) irradiance is observed because complete conical light bundles impinge on each of these field points. On a field point FP2 that is half shadowed by the stop element 4052, only half of the irradiance is achieved because one half of the conical light bundle is blocked by the stop element 4052. For a field point FP3 still further away from the center, only a single light ray is capable of passing the stop element 4052, and thus this field point FP3 belongs to the outer edge of the irradiance distribution 180 where the irradiance equals almost zero.

From the foregoing explanation it becomes clear that the distance $d_1$ has a significant impact on the irradiance distribution obtained in the field plane 162. The smaller the distance $d_1$ is, the steeper will be the flanks of the irradiance distribution 180.

On the other hand, also the maximum angle $\alpha_1$ influences the irradiance distribution in the field plane 162. For example, if $\alpha_1$ is increased, the irradiance distribution 180 would become broader with less steep slopes. However, since it is usually desired to have the same irradiance distribution in the field plane 162 (and of course in the conjugated reticle plane 168) independent of the selected illumination setting, it is necessary to displace the stop elements 4052 along the Z direction, as it is indicated in FIG. 14 by double headed arrows 184.

Figure 15:
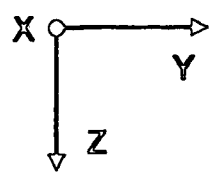
Figure 15:
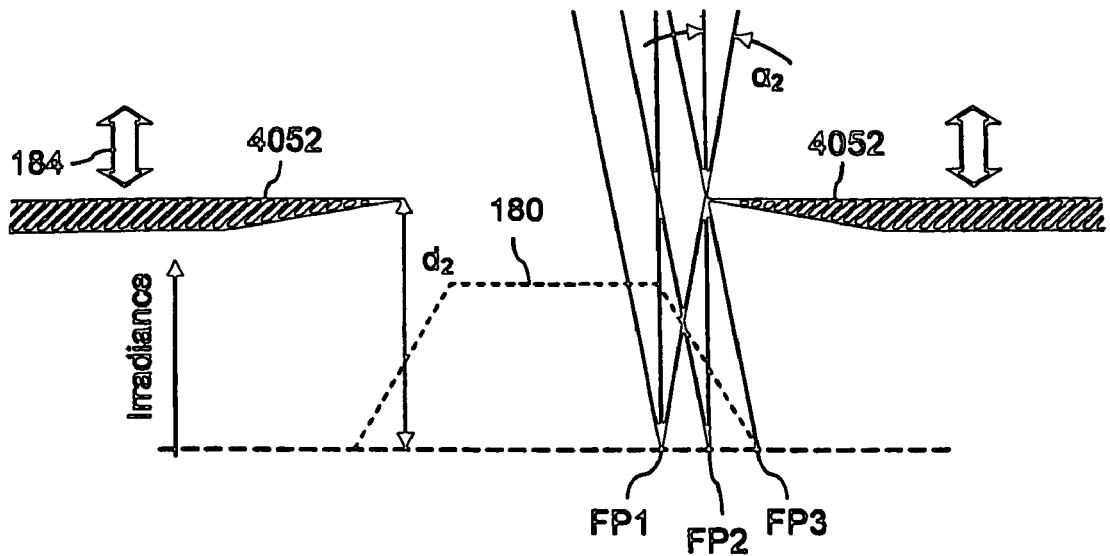

FIG. 15 shows the situation for a second conventional illumination setting with a larger maximum angle $\alpha_2$. In order to obtain the same irradiance distribution 180 in the field plane 162, the stop elements 4052 have been displaced towards the field plane 162 such that the distance between the stop elements 4052 and the field plane 162 is now $d_2<d_1$. The distance $d_2$ is selected such that exactly the same intensity distribution 180 is obtained in spite of the different illumination setting. This can be readily verified by examining the conditions prevailing at the field points FP1, FP2 and FP3.

If the illumination setting is manually set using micrometer screws or similar manipulators that modify the constellation of the zoom group 146 and the pair 148 of axicon elements 150, 152, the dose adjusting device 4048 comprising the stop element 4052 may be manually adjusted, too. To this end a table may be provided to an operator that contains set point values d for the distance between the stop element 4052 and the field plane 162 for each possible illumination setting.

In more sophisticated projection exposure apparatus, as the one shown in FIG. 13, the illumination setting is selected with the help of the apparatus control terminal 176. The control unit 174 then automatically activates the zoom manipulator 147 and the axicon manipulator 153 such that the selected illumination setting is obtained. The control unit 174 contains a functional relationship or a look-up table that yield the necessary values for the distance d in accordance with the selected illumination setting. The adjusting manipulator 170 is then activated accordingly.

Thus each change of the illumination setting usually implies that also the distance d between the dose adjusting device 4048 and the field plane 162 is modified automatically. This ensures that the irradiance distribution on the reticle plane 168 is at least substantially independent of the selected illumination setting.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An illumination system of a microlithographic projection exposure apparatus, comprising:
    a) an optical axis,
    b) illumination setting means capable of modifying the angular distribution of projection light in a reticle plane,
    c) an illumination dose adjustment device for adjusting the illumination dose on a photosensitive layer to be exposed, said illumination dose adjustment device comprising
        a plurality of stop elements which are, in a direction perpendicularly to a scanning direction of the microlithographic exposure apparatus, arranged next to one another, and
        a drive unit for displacing the stop elements individually along the scanning direction into a light field,
    d) a manipulator for displacing the illumination dose adjustment device along the optical axis,
        wherein the manipulator is configured to automatically displace the illumination dose adjustment device along the optical axis if the illumination setting means modifies the angular distribution.

2. An illumination system of a microlithographic projection exposure apparatus, comprising:
    a) an optical axis,
    b) illumination setting means capable of modifying the angular distribution of projection light in a reticle plane,
    c) an illumination dose adjustment device for adjusting the illumination dose on a photosensitive layer to be exposed, said illumination dose adjustment device comprising
        a plurality of stop elements which are, in a direction perpendicularly to a scanning direction of the microlithographic exposure apparatus, arranged next to one another, and
        a drive unit for displacing the stop elements individually along the scanning direction into a light field,
    d) a manipulator for displacing the illumination dose adjustment device along the optical axis, and
    e) a control unit that is connected to the illumination setting means and the manipulator and determines the axial position of the illumination dose adjustment device depending on the desired angular distribution,
        wherein the manipulator is configured to automatically displace the illumination dose adjustment device along the optical axis if the illumination setting means modifies the angular distribution.

3. An illumination system of a microlithographic projection exposure apparatus, comprising:
    a) an optical axis,
    b) illumination setting means capable of modifying the angular distribution of projection light in a reticle plane,
    c) an illumination dose adjustment device for adjusting the illumination dose on a photosensitive layer to be exposed, said illumination dose adjustment device comprising
        a plurality of stop elements which are, in a direction perpendicularly to a scanning direction of the microlithographic exposure apparatus, arranged next to one another, and
        a drive unit for displacing the stop elements individually along the scanning direction into a light field, d) a manipulator for displacing the illumination dose adjustment device along the optical axis, wherein:

the manipulator is configured to automatically displace the illumination dose adjustment device along the optical axis if the illumination setting means modifies the angular distribution;

each of the plurality of stop elements is an integral and unitary member; each of the plurality of stop elements has a first region adjacent a first end of the stop element, and a second region adjacent a second end of the stop element;

the first region of each of the plurality of stop elements absorbs substantially all projection light impinging thereon; and the second region of each of the plurality of stop elements has at least one recess, or the second region of each of the plurality of stop elements at least one opening therein.

* * * * *

UNITED STATES PATENT AND TRADEMARK OFFICE
CERTIFICATE OF CORRECTION

PATENT NO. : 7,551,263 B2  
APPLICATION NO. : 11/409387  
DATED : June 23, 2009  
INVENTOR(S) : Markus Deguenther and Toralf Gruner Page 1 of 1

It is certified that error appears in the above-identified patent and that said Letters Patent is hereby corrected as shown below:

Column 11, line 18, delete "meditational" insert --meridional--.

Column 12, line 25, delete "and" insert --and 140*a*,--.

Column 12, line 64, delete "$\alpha_1$is" insert --$\alpha_1$ is--.

Signed and Sealed this

Twenty-fifth Day of August, 2009

David J. Kappos
*Director of the United States Patent and Trademark Office*